(12) United States Patent
Policke et al.

(10) Patent No.: US 8,627,159 B2
(45) Date of Patent: Jan. 7, 2014

(54) FEEDBACK SCAN ISOLATION AND SCAN BYPASS ARCHITECTURE

(75) Inventors: Paul F. Policke, Austin, TX (US); Kim S. Hong, Austin, TX (US); Paul Douglas Bassett, Austin, TX (US)

(73) Assignee: QUALCOMM Incorporated, San Diego, CA (US)

( * ) Notice: Subject to any disclaimer, the term of this patent is extended or adjusted under 35 U.S.C. 154(b) by 561 days.

(21) Appl. No.: 12/944,090

(22) Filed: Nov. 11, 2010

(65) Prior Publication Data
US 2012/0124433 A1 May 17, 2012

(51) Int. Cl.
*G01R 31/28* (2006.01)

(52) U.S. Cl.
USPC .......................................................... 714/724

(58) Field of Classification Search
None
See application file for complete search history.

(56) References Cited

U.S. PATENT DOCUMENTS

| | | | | |
|---|---|---|---|---|
| 4,121,054 | A * | 10/1978 | Popkin | 370/498 |
| 5,150,044 | A * | 9/1992 | Hashizume et al. | 324/750.3 |
| 5,844,921 | A | 12/1998 | Bou-Ghazale et al. | |
| 5,889,788 | A | 3/1999 | Pressly et al. | |
| 5,909,453 | A * | 6/1999 | Kelem et al. | 714/727 |
| 6,028,983 | A * | 2/2000 | Jaber | 714/30 |
| 6,983,405 | B1 | 1/2006 | Herron et al. | |
| 7,080,300 | B1 | 7/2006 | Herron et al. | |
| 2003/0149922 | A1* | 8/2003 | Lai | 714/724 |
| 2009/0115453 | A1 | 5/2009 | Whetsel | |
| 2009/0206866 | A1 | 8/2009 | Shomrony et al. | |
| 2011/0040666 | A1* | 2/2011 | Crabtree et al. | 705/37 |
| 2011/0041018 | A1* | 2/2011 | Gunasekar | 714/726 |
| 2011/0061014 | A1* | 3/2011 | Frader-Thompson et al. | 715/771 |
| 2011/0066904 | A1* | 3/2011 | Lackey | 714/726 |

FOREIGN PATENT DOCUMENTS

WO 2007049172 A1 5/2007

OTHER PUBLICATIONS

International Search Report and Written Opinion—PCT/US2011/060372—ISA/EPO—Feb. 20, 2012.
Sinanoglu et al., "Isolation Techniques for Soft Cores", IEEE Transactions on Computer Aided Design of Integrated Circuits and Systems, Aug. 1, 2008, pp. 1453-1466, vol. 27, No. 8, IEEE Service Center, XP011227374, ISSN: 0278-0070, DOI: 10.1109/TCAD.2008.925794.

* cited by examiner

*Primary Examiner* — Gabriel Chu
(74) *Attorney, Agent, or Firm* — Peter Michael Kamarchik; Nicholas J. Pauley; Joseph Agusta

(57) ABSTRACT

A feedback scan isolation and bypass architecture apparatus and method. The apparatus includes core logic, and input and output multiplexers. The input multiplexer selectively provides a functional input or the core output to the core input based on a test signal. The output multiplexer selectively provides the core output or the input multiplexer output to a functional output based on the test signal. When the test signal indicates core feedback testing, the output multiplexer outputs the core output and the input multiplexer feeds back the core output to the core input. When the test signal indicates bypass testing, the input multiplexer outputs the functional input and the output multiplexer outputs the functional input bypassing the core logic. Logic can block the feedback or bypass signals when there are timing issues. Logic can modify the number of feedback or bypass signals when the number of functional inputs and outputs are different.

25 Claims, 6 Drawing Sheets

FEEDBACK SCAN ISOLATION AND SCAN BYPASS ARCHITECTURE

FIELD OF DISCLOSURE

The present disclosure relates generally to the testing of integrated circuit devices, and more particularly to feedback and bypass isolation testing of embedded cores and external circuitry in integrated circuit devices.

BACKGROUND

Many integrated circuit devices include at least one embedded core and external circuitry that provides inputs to and accepts outputs from the embedded core. The embedded core commonly has a plurality of inputs and outputs. It is advantageous to be able to isolate the embedded core from the external logic for core manufacturing testing, and to isolate the external logic from the embedded core for external logic manufacturing testing. Scan isolation feedback testing can be used to test the core separately from the external logic, and scan isolation bypass testing can be used to test the external circuitry separately from the core. However, scan isolation feedback and bypass testing can be difficult to implement without impacting the silicon area of the integrated circuit device.

Current scan isolation and bypass architectures may require the addition of a state element and a multiplexer for each of the inputs and outputs of the embedded core. This additional circuitry can require a large amount of silicon area on the die, especially when the core has a large number of input and output pins.

It would be desirable to have a scan isolation feedback and bypass architecture that does not need a state element for each input and output of the target core and that uses less silicon area for the scan isolation feedback and bypass circuitry, even when the target core has a large number of inputs and outputs.

SUMMARY

A scan isolation and bypass architecture is disclosed that includes core logic, an input isolation multiplexer and an output isolation multiplexer. The core logic receives a core logic input and produces a core logic output. The input isolation multiplexer includes a first input, a second input, a selection input and an output; and the input isolation multiplexer selectively provides one of the first and second inputs to the output based on the selection input. For the input isolation multiplexer, the first input is coupled to a functional input, the second input is coupled to a functional output, the output is coupled to the core logic input, and the selection input is coupled to a first test select signal. The output isolation multiplexer includes a first input, a second input, a selection input and an output; and the output isolation multiplexer selectively provides one of the first and second inputs to the output based on the selection input. For the output isolation multiplexer, the first input is coupled to the core logic output, the second input is coupled to the output of the input isolation multiplexer, the output provides the functional output, and the selection input is coupled to a second test select signal. When the first and second test select signals indicate a core feedback test, the output isolation multiplexer passes the core logic output from the first input of the output isolation multiplexer to the output of the output isolation multiplexer as the functional output, and the input isolation multiplexer passes the core logic output from the second input of the input isolation multiplexer to the output of the input isolation multiplexer and the core logic input. The scan isolation and bypass architecture can be configured so that when the first and second test select signals indicate a bypass test, the input isolation multiplexer passes the functional input from the first input of the input isolation multiplexer to the output of the input isolation multiplexer, and the output isolation multiplexer passes the functional input from the second input of the output isolation multiplexer to the output of the output isolation multiplexer as the functional output. The scan isolation and bypass architecture can be configured so that when the first and second test select signals indicate normal operation, the input isolation multiplexer passes the functional input from the first input of the input isolation multiplexer to the output of the input isolation multiplexer to be processed by the core logic, and the output isolation multiplexer passes the output of the core logic from the first input of the output isolation multiplexer to the output of the output isolation multiplexer as the functional output.

The scan isolation and bypass architecture can also include an at-speed signal and one or both of input AND logic and output AND logic. The input AND logic can include a first input coupled to the at-speed signal, a second input coupled to the functional output, and an output coupled to the second input of the input isolation multiplexer. When the at-speed signal has a first value, the input AND logic passes the functional output to the output of the input AND logic, and when the at-speed signal has a second value the input AND logic prevents the functional output from passing to the output of the input AND logic. The output AND logic can include a first input coupled to the at-speed signal, a second input coupled to the output of the input isolation multiplexer, and an output coupled to the second input of the output isolation multiplexer. When the at-speed signal has the first value, the output AND logic passes the output of the input isolation multiplexer to the output of the output AND logic, and when the at-speed signal has the second value the output AND logic prevents the output of the input isolation multiplexer from passing to the output of the output AND logic.

The scan isolation and bypass architecture can include exclusive-OR logic for situations where the number of functional inputs and outputs are different. When the functional input comprises N inputs and the functional output comprises M outputs, N being greater than M, the exclusive-OR logic can reduce the number of functional inputs to equal the number of functional outputs by receiving the output of the input isolation multiplexer and outputting the reduced output to the second input of the output isolation multiplexer. When the functional output comprises N outputs and the functional input comprises M inputs, the exclusive-OR logic can reduce the number of functional outputs to equal the number of functional inputs by receiving the functional output and an outputting the reduced output to the second input of the input isolation multiplexer.

The scan isolation and bypass architecture can be incorporated into a device selected from a group consisting of a music player, a video player, an entertainment unit, a navigation device, a communications device, a personal digital assistant (PDA), a fixed location data unit, and a computer.

A scan isolation and bypass architecture is disclosed that includes core logic means, an input selection means and an output selection means. The core logic means processes a core logic input to generate a core logic output. The input selection means passes one of a first input and a second input to an output based on a selection input. For the input selection means, the first input is coupled to a functional input, the second input is coupled to a functional output, the output is coupled to the core logic input, and the selection input is coupled to a first test select signal. The output selection means passes one of a first input and a second input to an output based on a selection input. For the output selection means, the first input is coupled to the core logic output, the second input is coupled to the output of the input selection means, the output provides the functional output, and the selection input is coupled to a second test select signal. When the first and second test select signals indicate a core feedback test, the output selection means passes the core logic output to the output of the output selection means as the functional output and the input selection means passes the core logic output to the output of the input selection means as the core logic input. The scan isolation and bypass architecture can be configured so that when the first and second test select signals indicate a bypass test, the input selection means passes the functional input to the output of the input selection means and the output selection means passes the functional input to the output of the output selection means as the functional output. The scan isolation and bypass architecture can be configured so that when the first and second test select signals indicate normal operation, the input selection means passes the functional input to the output of the input selection means to be processed by the core logic and the output selection means passes the output of the core logic to the output of the output selection means as the functional output.

A method of scan isolation and bypass testing for a core coupled to external logic is disclosed where the core has core inputs and core outputs, and the external logic provides functional inputs to the core inputs and accepts functional outputs from the core outputs. The method includes causing the functional inputs from the external logic to bypass the core and pass to the functional outputs when a test selection signal indicates bypass testing; causing the core outputs to feedback to the core inputs when the test selection signal indicates core logic feedback testing; and causing the functional inputs to be processed by the core and the core outputs to pass to the external logic as the functional outputs when the test selection signal indicates normal processing. The core outputs can be provided to the functional outputs when the test selection signal indicates core logic feedback testing. The feedback of the core outputs to the core inputs can be blocked when an at-speed signal indicates the core logic inputs are not synchronized to receive the feedback from the core outputs. The functional inputs from the external logic can be blocked from passing to the functional outputs when an at-speed signal indicates the external logic is not synchronized to receive the functional inputs. When there are more functional inputs than functional outputs and the test selection signal indicates bypass testing, the method can also include combining the functional inputs from the external logic to produce a reduced number of functional inputs equal to the number of functional outputs while bypassing the core, and passing the reduced number of functional inputs to the functional outputs. When there are more functional outputs than functional inputs and when the test selection signal indicates core logic feedback testing, the method can also include combining the core outputs to produce a reduced number of core outputs equal to the number of functional inputs, and feeding back the reduced number of core outputs to the core inputs. The combining can be done using exclusive-or logic.

For a more complete understanding of the present disclosure, reference is now made to the following detailed description and the accompanying drawings.

DETAILED DESCRIPTION

Figure 1:
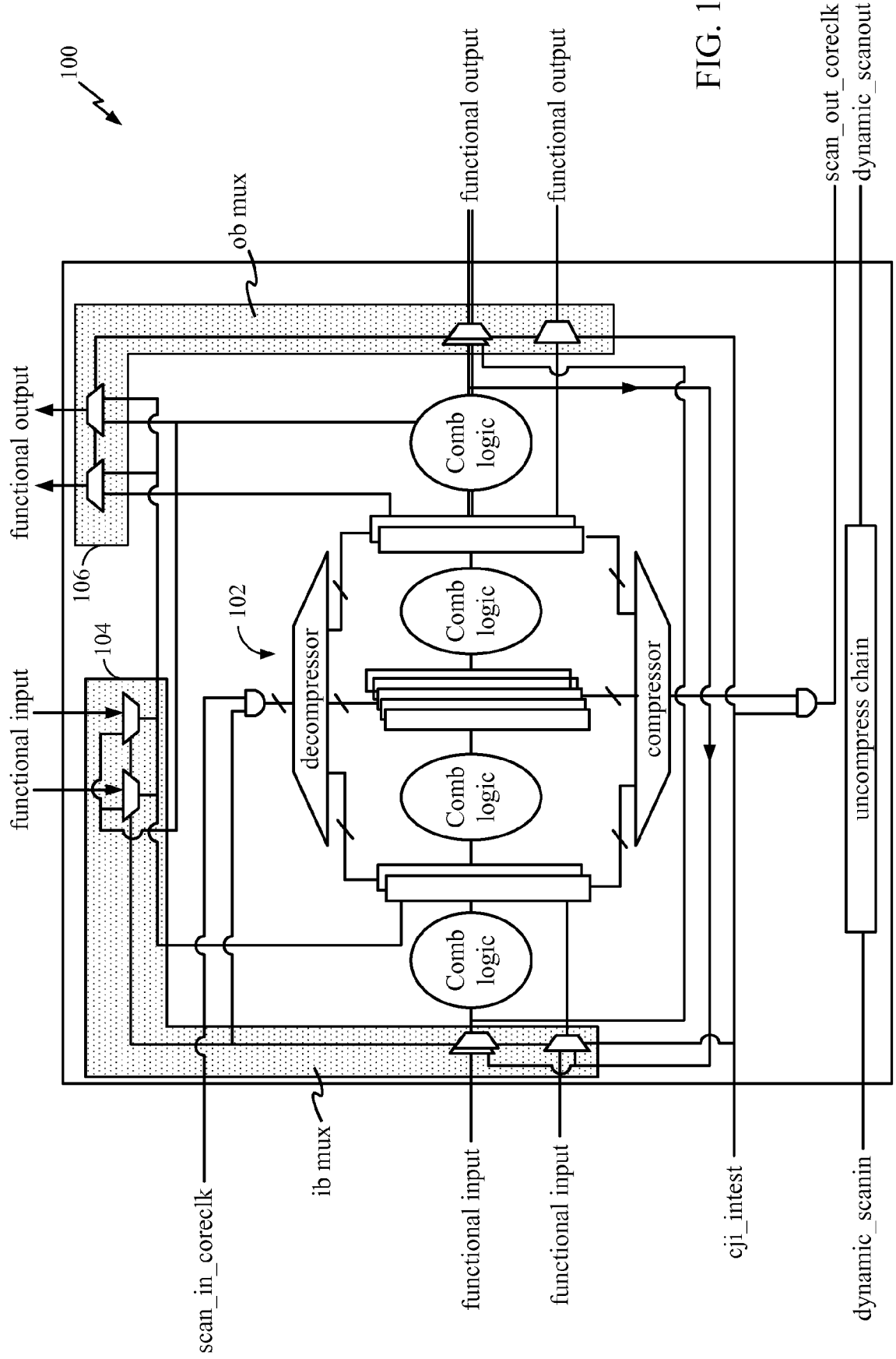
FIG. 1 is a block diagram showing an exemplary core and surrounding isolation circuitry.

FIG. 1 shows an exemplary block diagram 100 of a core 102, an input isolation multiplexer 104 and an output isolation multiplexer 106. The core includes a compressor, a decompressor, combinational logic and various other core logic circuitry. The core 102 receives functional inputs from external logic (not shown) and provides functional outputs to the external logic. The functional inputs from the external logic pass through the input isolation multiplexer 104 into the core 102, and the functional outputs pass from the core 102 through the output isolation multiplexer 106 to the external logic. The core 102 also receives external test control inputs including an in-test signal and an at-speed signal.

Figure 2:
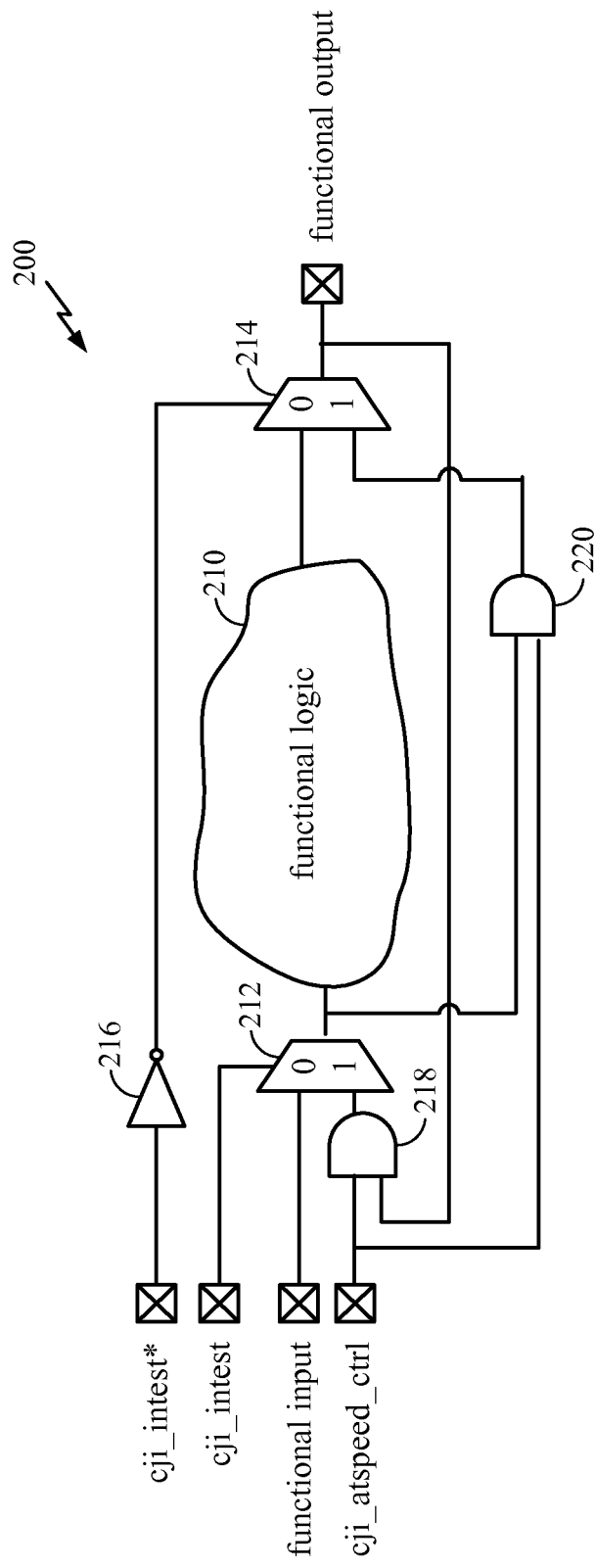
FIG. 2 is a block diagram showing an exemplary embodiment of a feedback scan isolation and scan bypass architecture when the number of functional inputs is equal to the number of functional outputs.

FIG. 2 shows a block diagram of an exemplary embodiment of a feedback scan isolation and scan bypass architecture 200 when there are an equal number of functional inputs and functional outputs. The feedback scan isolation and bypass architecture 200 includes functional or core logic 210, an input isolation multiplexer 212 and an output isolation multiplexer 214. The feedback scan isolation and bypass architecture 200 receives functional inputs from external logic (not shown) and supplies functional outputs to the external logic. The feedback scan isolation and bypass architecture 200 also receives an in-test signal, an in-test* signal and an at-speed signal. The in-test signal selects between feedback testing of the core logic or bypass testing of the external logic. The in-test* signal is also used to select between feedback testing or bypass testing, and to select normal, non-test functioning of the core. In feedback testing, the output of the core logic 210 is fed back to the input of the core logic 210. In bypass testing, the input from the external logic bypasses the core logic 210 and is routed to the output of the scan isolation architecture 200. In normal operation, the inputs from the external logic are processed by the core logic and are routed to the output of the scan isolation architecture 200.

The at-speed signal is used when necessary to account for differences in timing between the core logic 210 and the external logic. If clock latency differences are not an issue, the at-speed signal can be removed along with the associated circuitry described below.

It should be noted that there are commonly a plurality of functional inputs and functional outputs, and that the logic blocks in the scan isolation and bypass architecture 200 commonly have a plurality of input/output lines and can include a plurality of instances of the depicted logic device. However, for clarity single instances of the input/output lines and of the logic blocks are shown and explained with regard to FIGS. 2, 3 and 4.

The functional or core logic 210, which can include a plurality of logic devices and can have a plurality of inputs and outputs, for clarity is represented by a cloud having an input and an output. The input to the core logic 210 is coupled to the output of the input isolation multiplexer 212. The output from the core logic 210 is coupled to an input of the output isolation multiplexer 214.

The input isolation multiplexer 212, which can include a plurality of lines for each of its inputs and outputs and a plurality of 2-to-1 multiplexers, for clarity is represented by a single 2-to-1 multiplexer that includes two inputs, an output and a select input. The first input of the input isolation multiplexer 212 is coupled to the functional input from the external logic. The second input of the input isolation multiplexer 212 is coupled to the output of input AND logic 218. The output of the input isolation multiplexer 212 is coupled to the input of the core logic 210. The output of the input isolation multiplexer 212 is also coupled to an input of the output isolation multiplexer 214 through output AND logic 220. The select input of the input isolation multiplexer 212 is coupled to the in-test signal.

The input AND logic 218, which can include a plurality of lines for each of its inputs and outputs, for clarity is represented by an AND gate having two inputs and an output. The inputs to the input AND logic 218 are coupled to the at-speed signal and to a feedback of the functional output from the scan isolation architecture 200. The input AND logic 218 adjusts for timing differences based on the at-speed signal. Since the functional output commonly includes a plurality of signals, the input AND logic 218 commonly comprises a set of logic to AND the at-speed signal with the functional output. The input AND logic 218 allows the functional output to feedback through to the input isolation multiplexer 212 when the at-speed signal has a first value, and blocks the functional output when the at-speed signal has a second value. If clock speed differences are not an issue, the input AND logic 218 can be removed and the functional output can be coupled directly to the second input of the input isolation multiplexer 212.

The output isolation multiplexer 214, which can include a plurality of lines for each of its inputs and outputs and a plurality of 2-to-1 multiplexers, for clarity is represented by a single 2-to-1 multiplexer that includes two inputs, an output and a select input. The first input of the output isolation multiplexer 214 is coupled to the output from the core logic 210. The second input of the output isolation multiplexer 214 is coupled to the output of the output AND logic 220. The output of the output isolation multiplexer 214 provides the functional output from the scan isolation architecture 200. The select input of the output isolation multiplexer 214 is coupled to the in-test* signal through an inverter 216.

The output AND logic 220, which can include a plurality of lines for each of its inputs and outputs, for clarity is represented by an AND gate having two inputs and an output. The inputs to the output AND logic 220 are coupled to the at-speed signal and to the output of the input isolation multiplexer 212. The output AND logic 220 adjusts for timing differences based on the at-speed signal. Since the output of the input isolation multiplexer 212 commonly includes a plurality of output signals, the output AND logic 220 commonly comprises a set of logic gates to AND the at-speed signal with the output of the input isolation multiplexer 212. The output AND logic 220 allows the output from the input isolation multiplexer 212 to pass through to the output isolation multiplexer 214 when the at-speed signal has a first value, and blocks the output from the input isolation multiplexer 212 when the at-speed signal has a second value. If clock speed differences are not an issue, the output AND logic 220 can be removed and the output from the input isolation multiplexer 212 can be coupled directly to the second input of the output isolation multiplexer 214.

The in-test and in-test* signals can have a first value for bypass or external logic testing where the core logic 210 is bypassed. For the embodiment of FIG. 2, bypass testing is indicated when the in-test and in-test* signals have a "0" value. When the in-test signal has a "0" value at the select input of the input isolation multiplexer 212, the input isolation multiplexer 212 passes the functional input from the external logic to the output of the input isolation multiplexer 212. When the in-test* signal has the "0" value, due to the inverter 216, a "1" value is passed to the select input of the output isolation multiplexer 214. With a "1" value at the select input, the output isolation multiplexer 214 passes the output of the output AND logic 220 to the output of the output isolation multiplexer 214 as the functional output to the external logic. Alternatively, the inverter 216 can be eliminated by switching the inputs to the output isolation multiplexer 214 or by switching the polarity of the in-test* input. When the at-speed signal indicates no timing issues, the functional inputs from the external logic pass through the input isolation multiplexer 212, through the output AND logic 220 and through the output isolation multiplexer 214 as the functional output to the external logic. Thus, when the in-test and in-test* signals indicate bypass testing, the core logic 210 is bypassed and the functional inputs from the external logic are passed through the scan isolation architecture 200 to the external logic through the functional output.

The in-test and in-test* signals can have a second value for core logic feedback testing where the output from the core logic 210 is fed back to the input of the core logic 210. For the embodiment of FIG. 2, core logic feedback testing is indicated when the in-test and in-test* signals have a "1" value. When the in-test signal has a "1" value at the select input of the input isolation multiplexer 212, the input isolation multiplexer 212 passes the output of the input AND logic 218 to the output of the input isolation multiplexer 212. When the at-speed signal indicates no timing issues, the functional output of the scan isolation architecture 200 is fed back through the input AND logic 218 and through the input isolation multiplexer 212 to the input of the core logic 210. When the in-test signal has this second value for core logic feedback testing, due to the inverter 216, a "0" value is input to the select input of the output isolation multiplexer 214. With a "0" value at the select input, the output isolation multiplexer 214 passes the output of the functional logic 210 to the functional output. Thus, when the in-test and in-test* signals indicate core logic feedback testing and the at-speed signal indicates no timing issues, the output of the core logic 210 passes through the output multiplexer 214 and is fed back through the input AND gate 218 and the input multiplexer 212 to the input of the core logic 210, isolating the core logic 210 from the external logic. The output of the core logic 210 can be monitored at the functional output from the scan isolation architecture 200.

In the exemplary embodiment of FIG. 2, normal operation of the scan isolation architecture 200 can be implemented by setting the in-test signal to "0" and setting the in-test* signal to "1". When the in-test signal has a "0" value at the select input of the input isolation multiplexer 212, the input isolation multiplexer 212 passes the functional input from the external logic to the output of the input isolation multiplexer 212. When the in-test* signal has the "1" value, due to the inverter 216, a "0" value is passed to the select input of the output isolation multiplexer 214. With a "0" value at the select input, the output isolation multiplexer 214 passes the output of the core logic 210 to the output of the output isolation multiplexer 214 as the functional output to the external logic. Thus, when the in-test and in-test* signals indicate normal operation, the functional input from the external logic passes through the input multiplexer 212 to be processed by the core logic 210 and the output of the core logic 210 passes through the output multiplexer 214 to the external logic as the functional output of the scan isolation architecture 200.

Figure 3:
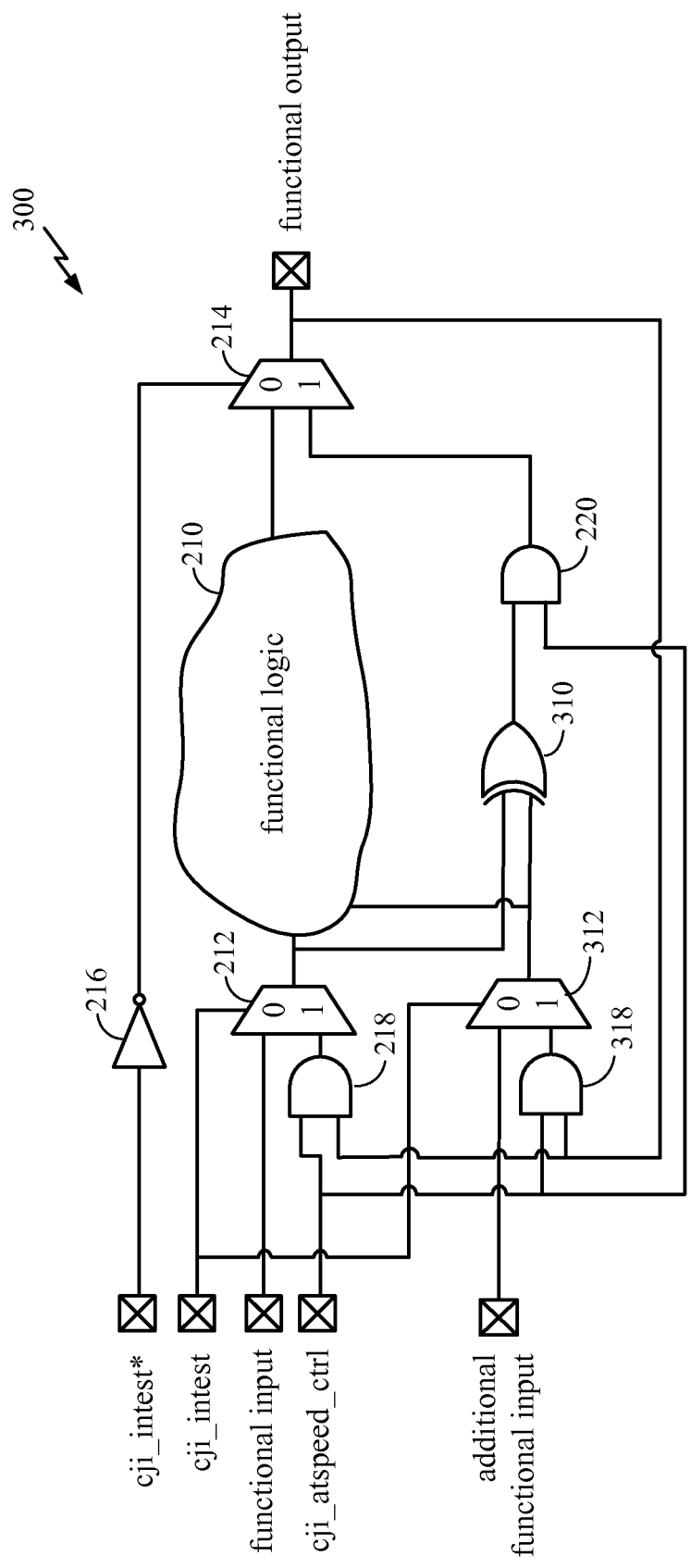
FIG. 3 is a block diagram showing an exemplary embodiment of a feedback scan isolation and scan bypass architecture when the number of functional inputs is greater than the number of functional outputs.

FIG. 3 shows a block diagram of an exemplary embodiment of a feedback scan isolation and scan bypass architecture 300 when there are more functional inputs than functional outputs. For example, there can be N functional inputs and M functional outputs, where N>M. The feedback scan isolation and bypass architecture 300 includes the core logic 210, the input isolation multiplexer 212 and the output isolation multiplexer 214. The scan isolation architecture 300 also shows an additional input multiplexer 312 and additional input AND logic 318 for processing the additional functional inputs from the external logic. The scan isolation architecture 300 receives functional inputs from the external logic and supplies functional outputs to the external logic. The scan isolation architecture 300 also receives the in-test signal, the in-test* signal and the at-speed signal. The inputs and processing of the core logic 210, the input isolation multiplexer 212, the output isolation multiplexer 214 and the output AND logic 220 are similar to the processing explained with regard to FIG. 2.

The feedback scan isolation and bypass architecture 300 also includes XOR logic 310. Since there are N functional inputs and M functional outputs, the XOR logic 310 comprises a set of logic to reduce the N functional inputs to M functional outputs. For clarity, the XOR logic 310 is represented by an XOR gate having two inputs and an output. The XOR logic 310 receives the outputs from the input isolation multiplexer 212 and from the additional input isolation multiplexer 312. The output of the XOR logic 310 is coupled to an input of the output AND logic 220.

The in-test and in-test* signals can have a first value for bypass or external logic testing where the core logic 210 is bypassed. For the embodiment of FIG. 3, bypass testing is indicated when the in-test and in-test* signals have a "0" value. When the in-test signal has a "0" value at the select input of the input isolation multiplexer 212, the input isolation multiplexer 212 passes the functional input from the external logic to the output of the input isolation multiplexer 212. When the in-test signal has a "0" value at the select input of the additional input isolation multiplexer 312, the additional input isolation multiplexer 312 passes the additional functional inputs from the external logic to the output of the additional input isolation multiplexer 312. Thus, the N functional inputs from the external logic pass through the input isolation multiplexers 212, 312 and are input to the XOR logic 310. The XOR logic 310 combines the N functional inputs to provide a reduced set of M outputs at the output of the XOR logic 310. When the at-speed signal indicates no timing issues, the M outputs from the XOR logic 310 pass through the output AND logic 220 to the second input of the output isolation multiplexer 214. When the in-test* signal has the "0" value, due to the inverter 216, a "1" value is passed to the select input of the output isolation multiplexer 214 causing the output isolation multiplexer 214 to pass the output of the output AND logic 220 to the output of the output isolation multiplexer 214 as the M functional outputs to the external logic. Thus, when the in-test and in-test* signals indicate bypass testing and the at-speed signal indicates no timing issues, the core logic 210 is bypassed and the N functional inputs from the external logic pass through the input isolation multiplexers 212, 312, and are reduced by the XOR logic 310 to produce M outputs that pass through the output AND logic 220 and the output isolation multiplexer 214 to the external logic as the functional output of the scan isolation and bypass architecture 300.

The in-test and in-test* signals can have a second value for core logic feedback testing where the output from the core logic 210 is fed back to the input of the core logic 210. For the embodiment of FIG. 3, core logic feedback testing is indicated when the in-test and in-test* signals have a "1" value. When the in-test signal has a "1" value at the select input of the input isolation multiplexer 212, the input isolation multiplexer 212 passes the output of the input AND logic 218 to the output of the input isolation multiplexer 212. When the at-speed signal indicates no timing issues, the functional output of the scan isolation architecture 300 is fed back through the input AND logic 218 and through the input isolation multiplexer 212 to the input of the core logic 210. When the in-test signal has a "1" value at the select input of the additional input isolation multiplexer 312, the additional input isolation multiplexer 312 passes the output of the additional input AND logic 318 to the output of the additional input isolation multiplexer 312. When the at-speed signal indicates no timing issues, the functional output of the scan isolation architecture 300 is fed back through the additional input AND logic 318 and through the additional input isolation multiplexer 312 and is provided as an additional input to the functional logic 210. When the in-test* signal has this second value for core logic feedback testing, due to the inverter 216, a "0" value is input to the select input of the output isolation multiplexer 214. With a "0" value at the select input, the output isolation multiplexer 214 passes the output of the core logic 210 to the functional output. Thus, when the in-test and in-test* signals indicate core logic feedback testing and the at-speed signal indicates no timing issues, the M outputs of the functional logic 210 pass through the output multiplexer 214 and are fed back through the input AND logics 218, 318 and the input multiplexers 212, 312 to provide N inputs to the core logic 210. Various methods can be used (for example, replicating, combining and augmenting) to process the M functional outputs of the core logic 210 to provide N functional inputs to the core logic 210. The output of the core logic 210 can be monitored at the functional output of the scan isolation architecture 300.

In the exemplary embodiment of FIG. 3, normal operation of the scan isolation architecture 300 can be implemented by setting the in-test signal to "0" and setting the in-test* signal to "1". When the in-test signal has a "0" value, the input isolation multiplexers 212 and 312 pass the functional inputs and additional functional inputs from the external logic to the inputs of the core logic 210. When the in-test* signal has the "1" value, due to the inverter 216, a "0" value is passed to the select input of the output isolation multiplexer 214. With a "0" value at the select input, the output isolation multiplexer 214 passes the output of the core logic 210 to the functional outputs to the external logic. Thus, when the in-test and in-test* signals indicate normal operation, the functional inputs from the external logic pass through the input isolation multiplexers 212, 312 to be processed by the core logic 210 and the output of the core logic 210 passes through the output isolation multiplexer 214 to the external logic as the functional output of the scan isolation architecture 300.

Figure 4:
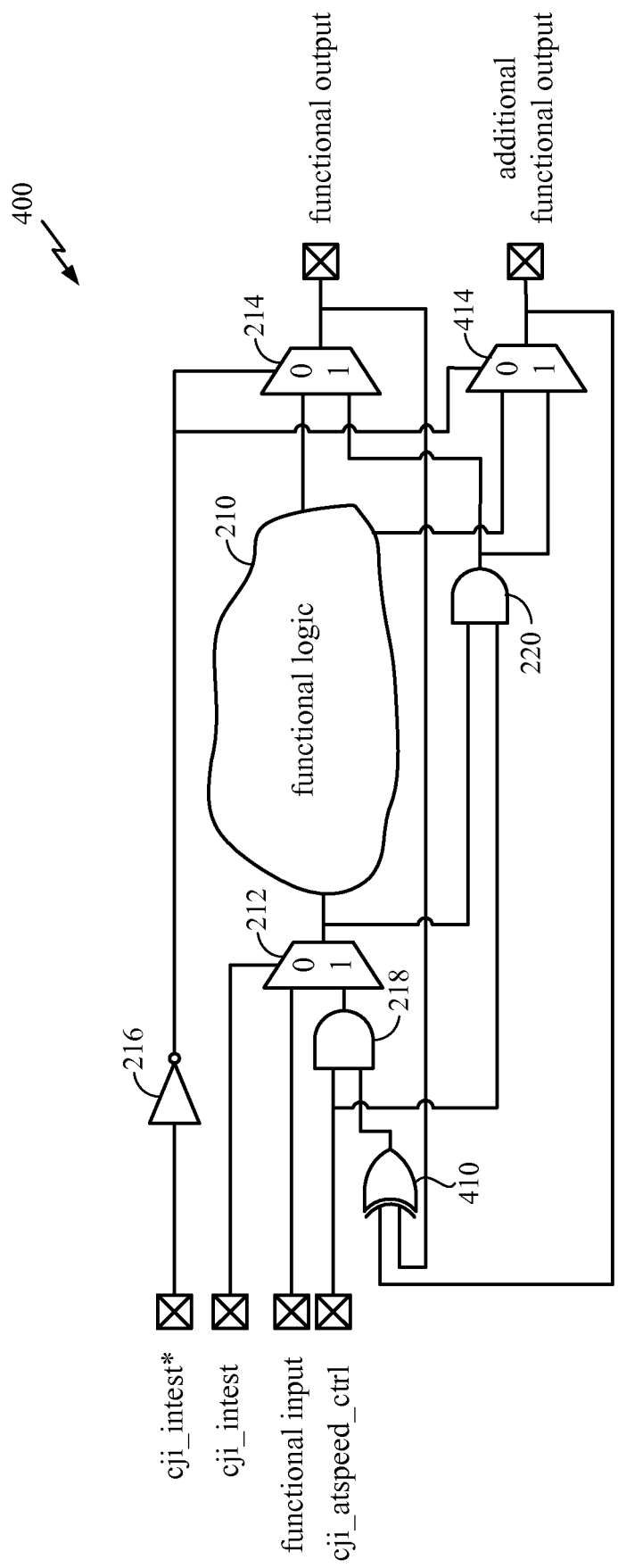
FIG. 4 is a block diagram showing an exemplary embodiment of a feedback scan isolation and scan bypass architecture when the number of functional inputs is less than the number of functional outputs.

FIG. 4 shows a block diagram of an exemplary embodiment of a feedback scan isolation and scan bypass architecture 400 when there are less functional inputs than functional outputs. For example, there can be M functional inputs and N functional outputs, where N>M. The feedback scan isolation and bypass architecture 400 includes the core logic 210, the input isolation multiplexer 212 and the output isolation multiplexer 214. The scan isolation architecture 400 also shows an additional output multiplexer 414 for processing the additional functional outputs from the core logic 210. The scan isolation architecture 400 receives functional inputs from the external logic and supplies functional outputs to the external logic. The scan isolation architecture 400 also receives the in-test signal, the in-test* signal and the at-speed signal. The inputs and processing of the core logic 210, the input isolation multiplexer 212, the output isolation multiplexer 214 and the output AND logic 220 are similar to the processing explained with regard to FIG. 2.

The feedback scan isolation and bypass architecture 400 also includes XOR logic 410. Since there are M functional inputs and N functional outputs, the XOR logic 410 comprises a set of logic to reduce the N functional outputs of the core logic 210 to M functional inputs. For clarity, the XOR logic 410 is represented by an XOR gate having two inputs and an output. The XOR logic 410 receives the functional outputs that are output from the output isolation multiplexer 214 and from the additional output isolation multiplexer 414. The output of the XOR logic 410 is coupled to an input of the input AND logic 218.

The in-test and in-test* signals can have a first value for bypass or external logic testing where the core logic 210 is bypassed. For the embodiment of FIG. 4, bypass testing is indicated when the in-test and in-test* signals have a "0" value. When the in-test signal has a "0" value at the select input of the input isolation multiplexer 212, the input isolation multiplexer 212 passes the functional input from the external logic to the output of the input isolation multiplexer 212. When the at-speed signal indicates no timing issues, the M functional inputs from the external logic pass through the output AND logic 220 to both the second input of the output isolation multiplexer 214 and the second input of the additional output isolation multiplexer 414. When the in-test* signal has the "0" value, due to the inverter 216, a "1" value is passed to the select inputs of the output isolation multiplexer 214 and of the additional output isolation multiplexer 414. With a "1" value at the select input, the output isolation multiplexer 214 passes the output of the output AND logic 220 to the output of the output isolation multiplexer 214 as the functional outputs to the external logic. With a "1" value at the select input, the additional output isolation multiplexer 414 passes the output of the output AND logic 220 to the output of the additional output isolation multiplexer 414 as the additional functional outputs to the external logic. Thus, when the in-test and in-test* signals indicate external logic testing and the at-speed signal indicates no timing issues, the core logic 210 is bypassed and the M functional inputs from the external logic pass through the input isolation multiplexer 212 and the output AND logic 220, and through the output isolation multiplexers 214, 414 to the external logic as the N functional outputs of the scan isolation and bypass architecture 400. Various methods can be used (for example, replicating, combining and augmenting) to process the M functional inputs from the external logic to provide N functional outputs to the external logic.

The in-test and in-test* signals can have a second value for core logic feedback testing where the output from the functional logic 210 is fed back to the input of the core logic 210. For the embodiment of FIG. 4, core logic feedback testing is indicated when the in-test and in-test* signals have a "1" value. The N functional outputs that are output by the output isolation multiplexers 214, 414 are fed back to the inputs of the XOR logic 410. The XOR logic 410 combines the N functional outputs to produce a reduced set of M outputs at the output of the XOR logic 410. The M outputs of the XOR logic 410 are coupled to the input AND logic 218. When the in-test signal has a "1" value at the select input of the input isolation multiplexer 212, the input isolation multiplexer 212 passes the output of the input AND logic 218 to the output of the input isolation multiplexer 212. When the at-speed signal indicates no timing issues, the N functional outputs of the scan isolation architecture 400 are fed back through and reduced by the XOR logic 410 to produce M outputs that are passed through the input AND logic 218 and the input isolation multiplexer 212 as the M inputs to the core logic 210. When the in-test* signal has this second value for core logic feedback testing, due to the inverter 216, a "0" value is input to the select inputs of the output isolation multiplexer 214 and the additional output isolation multiplexer 414. With a "0" value at the select inputs, the output isolation multiplexers 214, 414 pass the outputs of the core logic 210 to the functional outputs and additional functional outputs of the scan isolation architecture 400. Thus, when the in-test and in-test* signals indicate core logic feedback testing and the at-speed signal indicates no timing issues, the N outputs of the core logic 210 pass through the output multiplexers 214, 414 and are fed back through the XOR logic 410 which reduces/combines the functional outputs to produce M outputs that pass through the input AND logic 218 and the input multiplexer 212 to provide M inputs to the core logic 210.

In the exemplary embodiment of FIG. 4, normal operation of the scan isolation architecture 400 can be implemented by setting the in-test signal to "0" and setting the in-test* signal to "1". When the in-test signal has a "0" value, the input isolation multiplexer 212 passes the functional input from the external logic to the input of the core logic 210. When the in-test* signal has the "1" value, due to the inverter 216, a "0" value is passed to the select inputs of the output isolation multiplexers 214, 414. With a "0" value at the select inputs, the output isolation multiplexers 214, 414 pass the outputs of the core logic 210 to the functional outputs and additional functional outputs. Thus, when the in-test and in-test* signals indicate normal operation, the functional inputs from the external logic pass through the input isolation multiplexer 212 to be processed by the core logic 210 and the output of the core logic 210 passes through the output isolation multiplexers 214, 414 to the external logic as the functional outputs of the scan isolation architecture 400.

Figure 5:
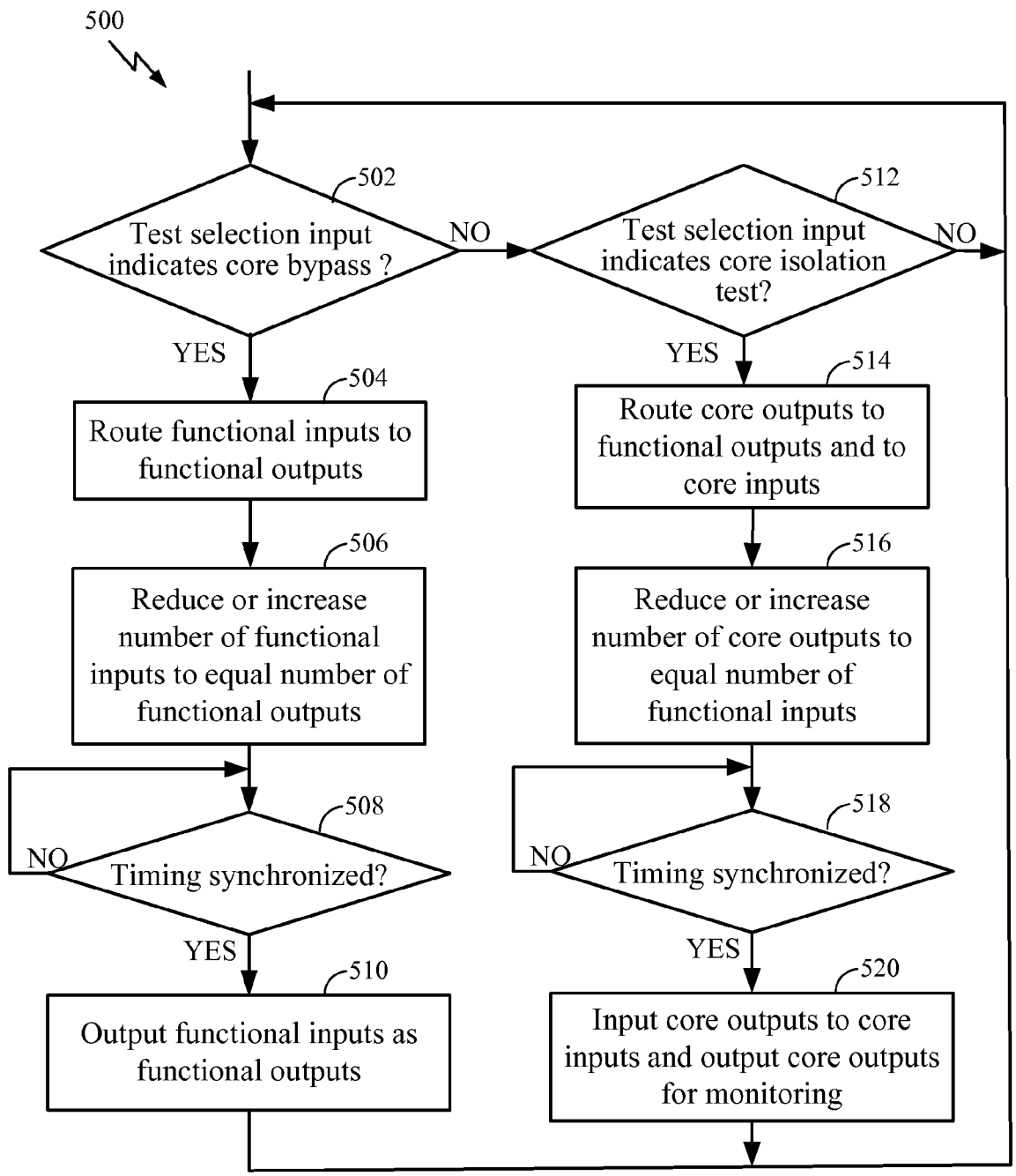
FIG. 5 is a block diagram showing an exemplary embodiment of a control diagram for a feedback scan isolation and scan bypass architecture.

FIG. 5 shows an exemplary control diagram 500 for a feedback scan isolation and scan bypass system. At block 502, it is determined whether a test selection input indicates core bypass testing. The test selection input could be the in-test signal described in the embodiments of FIGS. 2, 3 and 4. If the test selection input indicates core bypass testing, control is passed to block 504. If the test selection input does not indicate core bypass testing, control is passed to block 512.

At block 504, core bypass testing is started by routing the functional inputs to the system to the functional outputs of the system, and control passes to block 506. At block 506, the number of functional inputs can be increased or reduced as necessary so the number of functional inputs equals the number of functional outputs. The number of functional inputs can be reduced using XOR logic 310 as shown in FIG. 3, or by ignoring the excess inputs, or by other methods. The number of functional inputs can be increased by routing certain inputs to multiple outputs, or by augmenting the functional inputs with additional signals of known or unspecified values, or by other methods. After any necessary increasing or reducing of the number of functional inputs, control passes to block 508.

At block 508, it is determined whether timing is synchronized to output the functional inputs of the system to the external logic. Timing synchronization can be checked using an at-speed signal as explained in the embodiments of FIGS. 2, 3 and 4. In some systems, it may not be necessary to check timing. If the timing is not synchronized, control stays at block 508 until the timing is synchronized. Once the timing is synchronized, control passes to block 510 where the functional inputs, with any necessary increase or reduction, are output to the external logic as functional outputs. From block 510, control can return to block 502 to check for further testing.

At block 512, it is determined whether a test selection input indicates core isolation testing. If the test selection input indicates core isolation testing, control is passed to block 514. If the test selection input does not indicate core isolation testing, control can return to block 502 to check for testing.

At block 514, core isolation testing is started by routing the core outputs, such as the outputs of the functional logic 210, to the functional outputs of the system and to the core inputs. Control then passes to block 516. At block 516, the number of core outputs can be increased or reduced as necessary so the number of core outputs equals the number of functional inputs. The number of core outputs can be reduced using XOR logic 410 as shown in FIG. 4, or by ignoring the excess outputs, or by other methods. The number of core outputs can be increased by routing certain core outputs to multiple core inputs, or by augmenting the core outputs with additional signals of known or unspecified values, or by other methods. After any necessary increasing or reducing of the number of core outputs, control passes to block 518.

At block 518, it is determined whether timing is synchronized to input the feedback of the core output to the inputs of the core logic. Timing synchronization can be checked using an at-speed signal as explained in the embodiments of FIGS. 2, 3 and 4. In some systems, it may not be necessary to check timing. If the timing is not synchronized, control stays at block 518 until the timing is synchronized. Once the timing is synchronized, control passes to block 520 where the core outputs, with any necessary increase or reduction, are input to the core logic as functional inputs. The core outputs can also be made available for monitoring. The monitoring output may not be dependent on the timing synchronization. From block 520 control can return to block 502 to check for further testing.

Figure 6:
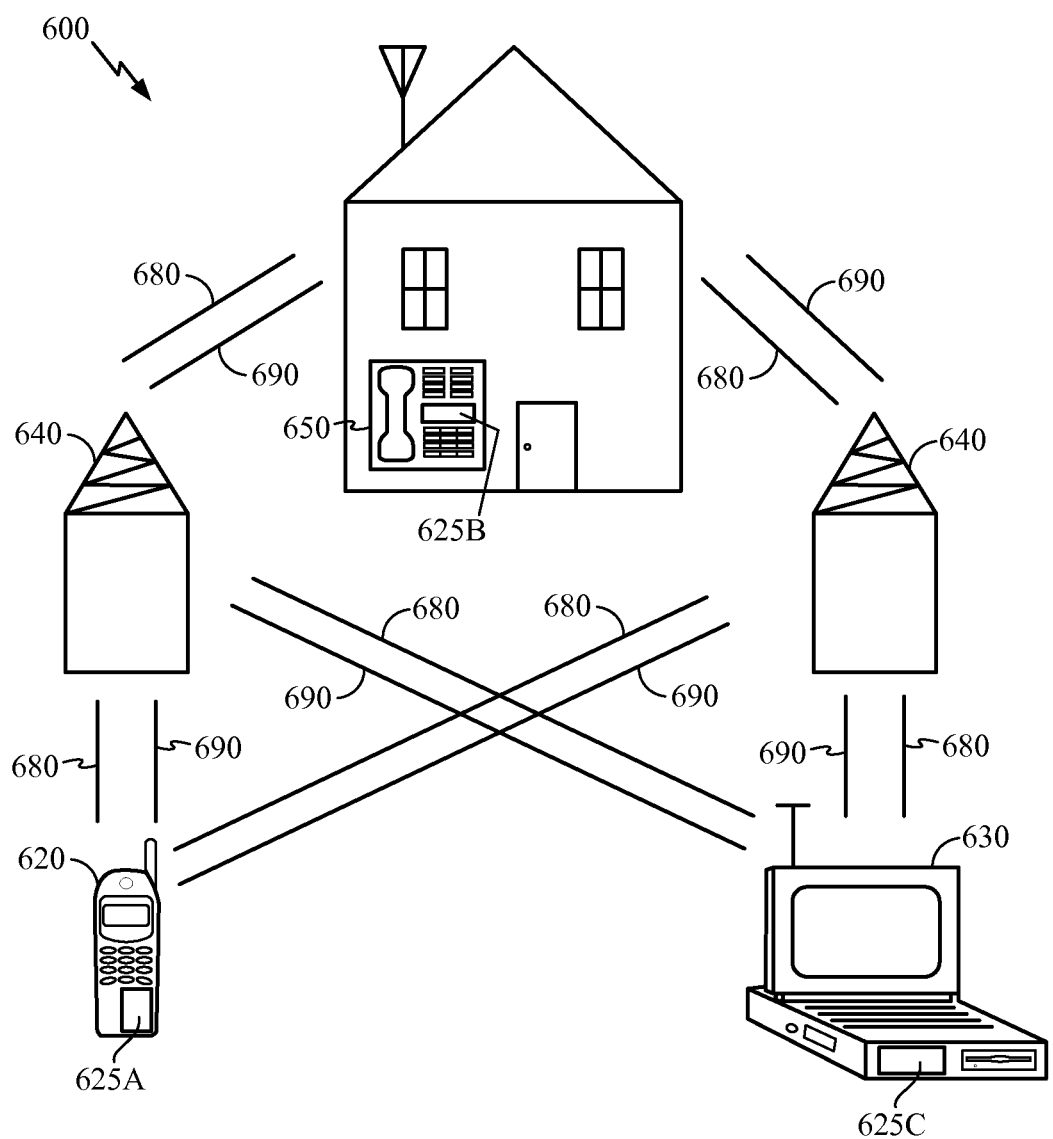
FIG. 6 is a block diagram showing an exemplary wireless communication system in which feedback scan isolation and scan bypass architecture may be advantageously employed.

FIG. 6 shows an exemplary wireless communication system 600 in which an embodiment of the feedback scan isolation and bypass architecture may be advantageously employed. For purposes of illustration, FIG. 6 shows three remote units 620, 630, and 650 and two base stations 640. It should be recognized that typical wireless communication systems may have many more remote units and base stations. Any of the remote units 620, 630, and 650 may include the feedback scan isolation and bypass architecture as disclosed herein. FIG. 6 shows forward link signals 680 from the base stations 640 and the remote units 620, 630, and 650 and reverse link signals 690 from the remote units 620, 630, and 650 to base stations 640.

In FIG. 6, remote unit 620 is shown as a mobile telephone, remote unit 630 is shown as a portable computer, and remote unit 650 is shown as a fixed location remote unit in a wireless local loop system. For example, the remote units may be cell phones, hand-held personal communication systems (PCS) units, portable data units such as personal data assistants, or fixed location data units such as meter reading equipment.

Although FIG. 6 illustrates certain exemplary remote units that may include the feedback scan isolation and bypass architecture as disclosed herein, the architectures and methods as disclosed herein are not limited to these exemplary illustrated units. Embodiments may be suitably employed in any electronic device in which feedback scan isolation and bypass architectures are desired.

While exemplary embodiments incorporating the principles of the present invention have been disclosed hereinabove, the present invention is not limited to the disclosed embodiments. After reading the present disclosure, those of skill in the art will realize many variations can be made, for example the feedback from the output of the output isolation multiplexer 214 in FIGS. 2-4 can alternatively be taken from the outputs of the core logic 210. The present application is intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A scan isolation and bypass architecture comprising core logic having a core logic input and a core logic output; an input isolation multiplexer having a first input, a second input, a selection input and an output, the input isolation multiplexer selectively providing one of the first and second inputs of the input isolation multiplexer to the output of the input isolation multiplexer based on the selection input of the input isolation multiplexer, the first input of the input isolation multiplexer being coupled to a functional input, the second input of the input isolation multiplexer being coupled to a functional output, the output of the input isolation multiplexer being coupled to the core logic input, and the selection input of the input isolation multiplexer being coupled to a first test select signal;

an output isolation multiplexer having a first input, a second input, a selection input and an output, the output isolation multiplexer selectively providing one of the first and second inputs of the output isolation multiplexer to the output of the output isolation multiplexer based on the selection input of the output isolation multiplexer, the first input of the output isolation multiplexer being coupled to the core logic output, the second input of the output isolation multiplexer being coupled to the output of the input isolation multiplexer, the output of the output isolation multiplexer providing the functional output, and the selection input of the output isolation multiplexer being coupled to a second test select signal;

wherein when the first and second test select signals indicate a core feedback test, the output isolation multiplexer passes the core logic output from the first input of the output isolation multiplexer to the output of the output isolation multiplexer as the functional output, and the input isolation multiplexer passes the core logic output from the second input of the input isolation multiplexer to the output of the input isolation multiplexer and the core logic input.

2. The scan isolation and bypass architecture of claim 1, wherein when the first and second test select signals indicate a bypass test, the input isolation multiplexer passes the functional input from the first input of the input isolation multiplexer to the output of the input isolation multiplexer, and the output isolation multiplexer passes the functional input from the second input of the output isolation multiplexer to the output of the output isolation multiplexer as the functional output.

3. The scan isolation and bypass architecture of claim 2, wherein when the first and second test select signals indicate a normal operation, the input isolation multiplexer passes the functional input from the first input of the input isolation multiplexer to the output of the input isolation multiplexer to be processed by the core logic, and the output isolation multiplexer passes the output of the core logic from the first input of the output isolation multiplexer to the output of the output isolation multiplexer as the functional output.

4. The scan isolation and bypass architecture of claim 2, further comprising an at-speed signal and input AND logic, the input AND logic comprising:
   a first input coupled to the at-speed signal,
   a second input coupled to the functional output, and
   an output coupled to the second input of the input isolation multiplexer;
wherein when the at-speed signal has a first value the input AND logic passes the functional output to the output of the input AND logic, and when the at-speed signal has a second value the input AND logic prevents the functional output from passing to the output of the input AND logic.

5. The scan isolation and bypass architecture of claim 4, further comprising output AND logic comprising:
   a first input coupled to the at-speed signal,
   a second input coupled to the output of the input isolation multiplexer, and
   an output coupled to the second input of the output isolation multiplexer;
wherein when the at-speed signal has the first value the output AND logic passes the output of the input isolation multiplexer to the output of the output AND logic, and when the at-speed signal has the second value the output AND logic prevents the output of the input isolation multiplexer from passing to the output of the output AND logic.

6. The scan isolation and bypass architecture of claim 2, further comprising an at-speed signal and output AND logic, the output AND logic comprising:
   a first input coupled to the at-speed signal,
   a second input coupled to the output of the input isolation multiplexer, and
   an output coupled to the second input of the output isolation multiplexer;
wherein when the at-speed signal has a first value the output AND logic passes the output of the input isolation multiplexer to the output of the output AND logic, and when the at-speed signal has a second value the output AND logic prevents the output of the input isolation multiplexer from passing to the output of the output AND logic.

7. The scan isolation and bypass architecture of claim 1, wherein the functional input comprises N inputs and the functional output comprises M outputs, N being greater than M; and wherein the scan isolation and bypass architecture further comprises:
   exclusive-OR logic for reducing the number of functional inputs to equal the number of functional outputs, the exclusive-OR logic comprising:
      an input coupled to the output of the input isolation multiplexer, and
      an output coupled to the second input of the output isolation multiplexer, the output of the input isolation multiplexer being coupled to the second input of the output isolation multiplexer through the exclusive-OR logic.

8. The scan isolation and bypass architecture of claim 7, further comprising an at-speed signal and output AND logic, the output AND logic comprising:
   a first input coupled to the at-speed signal,
   a second input coupled to the output of the exclusive-OR logic, and
   an output coupled to the second input of the output isolation multiplexer, the output of the exclusive-OR logic being coupled to the second input of the output isolation multiplexer through the output AND logic;
wherein when the at-speed signal has a first value the output AND logic passes the output of the exclusive-OR logic to the output of the output AND logic, and when the at-speed signal has a second value the output AND logic prevents the output of the exclusive-OR logic from passing to the output of the output AND logic.

9. The scan isolation and bypass architecture of claim 1, wherein the functional output comprises N outputs and the functional input comprises M inputs, N being greater than M; and wherein the scan isolation and bypass architecture further comprises:
   exclusive-OR logic for reducing the number of functional outputs to equal the number of functional inputs, the exclusive-OR logic comprising:
      an input coupled to the functional output, and
      an output coupled to the second input of the input isolation multiplexer, the functional output being coupled to the second input of the input isolation multiplexer through the exclusive-OR logic.

10. The scan isolation and bypass architecture of claim 9, further comprising an at-speed signal and input AND logic, the input AND logic comprising:
    a first input coupled to the at-speed signal,
    a second input coupled to the output of the exclusive-OR logic, and
    an output coupled to the second input of the input isolation multiplexer, the output of the exclusive-OR logic being coupled to the second input of the input isolation multiplexer through the input AND logic;
wherein when the at-speed signal has a first value the input AND logic passes the output of the exclusive-OR logic to the output of the input AND logic, and when the at-speed signal has a second value the input AND logic prevents the output of the exclusive-OR logic from passing to the output of the input AND logic.

11. The scan isolation and bypass architecture of claim 1 incorporated into a device selected from a group consisting of a music player, a video player, an entertainment unit, a navigation device, a communications device, a personal digital assistant (PDA), a fixed location data unit, and a computer.

12. A scan isolation and bypass architecture comprising
    core logic means for processing a core logic input to generate a core logic output;
    an input selection means for passing one of a first input and a second input to an output based on a selection input, the first input of the input selection means being coupled to a functional input, the second input of the input selection means being coupled to a functional output, the output of the input selection means being coupled to the core logic input, and the selection input of the input selection means being coupled to a first test select signal;
    an output selection means for passing one of a first input and a second input to an output based on a selection input, the first input of the output selection means being coupled to the core logic output, the second input of the output selection means being coupled to the output of the input selection means, the output of the output selection means providing the functional output, and the selection input of the output selection means being coupled to a second test select signal;

wherein when the first and second test select signals indicate a core feedback test, the output selection means passes the core logic output to the output of the output selection means as the functional output and the input selection means passes the core logic output to the output of the input selection means as the core logic input.

13. The scan isolation and bypass architecture of claim 12, wherein when the first and second test select signals indicate a bypass test, the input selection means passes the functional input to the output of the input selection means and the output selection means passes the functional input to the output of the output selection means as the functional output.

14. The scan isolation and bypass architecture of claim 13, wherein when the first and second test select signals indicate normal operation, the input selection means passes the functional input to the output of the input selection means to be processed by the core logic and the output selection means passes the output of the core logic to the output of the output selection means as the functional output.

15. A method of scan isolation and bypass testing for a core coupled to external logic, the core having core inputs and core outputs, the external logic providing functional inputs to the core inputs and accepting functional outputs from the core outputs, the method comprising:

causing the functional inputs from the external logic to bypass the core and pass to the functional outputs when a test selection signal indicates bypass testing;

causing the core outputs to feedback to the core inputs when the test selection signal indicates core logic feedback testing; and causing the functional inputs to be processed by the core and the core outputs to pass to the external logic as the functional outputs when the test selection signal indicates normal processing.

16. The method of claim 15, further comprising:
providing the core outputs to the functional outputs when the test selection signal indicates core logic feedback testing.

17. The method of claim 15, further comprising:
blocking the feedback of the core outputs to the core inputs when an at-speed signal indicates the core logic inputs are not synchronized to receive the feedback from the core outputs.

18. The method of claim 17, further comprising:
blocking the functional inputs from the external logic from passing to the functional outputs when an at-speed signal indicates the external logic is not synchronized to receive the functional inputs.

19. The method of claim 15, further comprising:
blocking the functional inputs from the external logic from passing to the functional outputs when an at-speed signal indicates the external logic is not synchronized to receive the functional inputs.

20. The method of claim 15, wherein when there are more functional inputs than functional outputs, the method further comprising, when the test selection signal indicates bypass testing:

combining the functional inputs from the external logic to produce a reduced number of functional inputs equal to the number of functional outputs while bypassing the core, and passing the reduced number of functional inputs to the functional outputs.

21. The method of claim 20, wherein the combining is done using exclusive-or logic.

22. The method of claim 20, further comprising:
blocking the reduced number of functional inputs from passing to the functional outputs when an at-speed signal indicates the external logic is not synchronized to receive the reduced number of functional inputs.

23. The method of claim 15, wherein when there are more functional outputs than functional inputs, the method further comprising, when the test selection signal indicates core logic feedback testing:

combining the core outputs to produce a reduced number of core outputs equal to the number of functional inputs, and feeding back the reduced number of core outputs to the core inputs.

24. The method of claim 23, wherein the combining is done using exclusive-or logic.

25. The method of claim 23, further comprising:
blocking the feedback of the reduced number of core outputs to the core inputs when an at-speed signal indicates the core logic inputs are not synchronized to receive the feedback of the reduced number of core outputs.

* * * * *